(12) United States Patent
Yamamoto et al.

(10) Patent No.: US 12,078,675 B2
(45) Date of Patent: Sep. 3, 2024

(54) CALIBRATION METHOD, CALIBRATION APPARATUS, AND PROGRAM

(71) Applicant: NEC CORPORATION, Tokyo (JP)

(72) Inventors: Tsuyoshi Yamamoto, Tokyo (JP); Yoshihito Hashimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 850 days.

(21) Appl. No.: 17/036,820

(22) Filed: Sep. 29, 2020

(65) Prior Publication Data

US 2021/0116499 A1 Apr. 22, 2021

(30) Foreign Application Priority Data

Oct. 18, 2019 (JP) ................. 2019-191538

(51) Int. Cl.
| | |
|---|---|
| *G01R 31/317* | (2006.01) |
| *G06N 10/20* | (2022.01) |
| *G06N 10/40* | (2022.01) |
| *H03J 3/12* | (2006.01) |
| *H10N 60/00* | (2023.01) |

(52) U.S. Cl.
CPC ....... *G01R 31/31702* (2013.01); *G06N 10/20* (2022.01); *G06N 10/40* (2022.01); *H03J 3/12* (2013.01); *H10N 60/00* (2023.02)

(58) Field of Classification Search
None
See application file for complete search history.

(56) References Cited

U.S. PATENT DOCUMENTS

| | | | | |
|---|---|---|---|---|
| 5,099,200 A | * | 3/1992 | Tarantino ............. | G01R 35/005 455/226.1 |
| 2017/0012631 A1 | * | 1/2017 | Dato ..................... | H03L 7/0994 |
| 2017/0310278 A1 | * | 10/2017 | Sachs ...................... | H03L 7/14 |

(Continued)

FOREIGN PATENT DOCUMENTS

| | | |
|---|---|---|
| JP | 2017-028635 A | 2/2017 |
| JP | 2017-073106 A | 4/2017 |

OTHER PUBLICATIONS

Shruti Puri et al., "Quantum annealing with all-to-all connected nonlinear oscillators", Nature Communications, Jun. 8, 2017, pp. 1-9, vol. 8, No. 15785.

(Continued)

*Primary Examiner* — Nasima Monsur
(74) *Attorney, Agent, or Firm* — Sughrue Mion, PLLC

(57) ABSTRACT

A calibration method, a calibration apparatus, and a program capable of estimating a degree of signal loss of an input signal supplied to an oscillator are provided. The calibration method includes: outputting an input signal to be input to an oscillator to be calibrated that includes a resonator and performs parametric oscillation, from a signal generator connected to the resonator via a transmission path while sweeping a frequency or a power of this input signal; acquiring distribution data of an intensity of a reflection signal based on measurement of the intensity of the reflection signal from the oscillator in response to the input signal; and estimating a degree of signal loss by comparing the distribution data acquired by the measurement with the distribution data theoretically obtained in which a value of the degree of the signal loss of the transmission path is assumed.

8 Claims, 9 Drawing Sheets

(56) References Cited

U.S. PATENT DOCUMENTS

2018/0017978 A1* 1/2018 Goto .................... H03B 15/003
2018/0260732 A1* 9/2018 Bloom ................. H03K 19/195

OTHER PUBLICATIONS

Wolfgang Lechner et al., "A quantum annealing architecture with all-to-all connectivity from local interactions", Quantum Mechanics, Oct. 23, 2015, 6 pgs.

JP Office Communication for JP Application No. 2019-191538, mailed on Nov. 28, 2023 with English Translation.

* cited by examiner

CALIBRATION METHOD, CALIBRATION APPARATUS, AND PROGRAM

INCORPORATION BY REFERENCE

This application is based upon and claims the benefit of priority from Japanese patent application No. 2019-191538, filed on Oct. 18, 2019, the disclosure of which is incorporated herein in its entirety by reference.

TECHNICAL FIELD

The present disclosure relates to a calibration method regarding an input signal to be input to an oscillator that forms a quantum annealing circuit.

BACKGROUND ART

In recent years, studies of quantum computers that use superconducting devices have been conducted. For example, Japanese Unexamined Patent Application Publication No. 2017-73106 and S. Puri, et al., "Quantum annealing with all-to-all connected nonlinear oscillators," Nature Comm., 2017. (hereinafter this document will be referred to as the document Puri) both disclose a quantum annealing circuit that uses a superconducting non-linear oscillator as quantum bits. Further, W. Lechner, et al., "A quantum annealing architecture with all-to-all connectivity from local interactions," Science Advances 23, 2015, Vol. 1, no. 9, e1500838. proposes a coupling method called an LHZ scheme regarding coupling of quantum bits. The LHZ scheme is a scheme of visually canceling interactions between spins and achieving the entire coupling in hardware in a simple manner by replacing two interacting spins with one spin.

By using the quantum annealing circuit, combinatorial optimization problems can be solved. It can be said that solving combinatorial optimization problems is equal to obtaining a ground state of an Ising model, or in other words, obtaining the state of each spin in which the Hamiltonian of the Ising model becomes a minimum. The Ising model indicates a system in which a plurality of spins that may have either an upward state or a downward state interact with one another.

The quantum annealing circuit in which the Ising model is implemented in the form of a circuit is formed by coupling a plurality of quantum bits likened to spins to each other. Each of the quantum bits may have either an upward state or a downward state. In order to map the optimization problem to be solved to the Ising model, it is required to supply an appropriate input signal to the oscillator that forms a quantum annealing circuit.

SUMMARY

While the oscillator is cooled to an extremely low temperature in a freezer, a signal generator that supplies an input signal to this oscillator is provided at a room temperature. Then a coaxial cable, a circulator and the like are, for example, interposed between the signal generator and an input node of the oscillator. Therefore, a power loss is actually generated in an input signal that is supplied to the oscillator.

Since the amount of this power loss is unknown, there is a problem that it is difficult to accurately supply an input signal having an appropriate power to the input node. Therefore, there is a demand for a technique for performing a calibration regarding which power value an input signal output from the signal generator should have in order to supply an appropriate power to the input node.

One object of the present disclosure is to provide a calibration method, a calibration apparatus, and a program capable of estimating the degree of the signal loss of the input signal to be supplied to the oscillator.

A calibration method according to a first aspect of the present disclosure includes:
outputting an input signal to be input to an oscillator to be calibrated that includes a resonator, which is a superconducting circuit, and performs parametric oscillation, from a signal generator connected to the resonator via a transmission path while sweeping a frequency or a power of this input signal;
acquiring distribution data of an intensity of a reflection signal based on measurement of the intensity of the reflection signal from the oscillator in response to the input signal; and
estimating a degree of signal loss by comparing the distribution data acquired by the measurement with the distribution data theoretically obtained in which a value of the degree of the signal loss of the transmission path is assumed.

A calibration apparatus according to a second aspect of the present disclosure includes:
an input signal controller configured to control an input signal to be input to an oscillator to be calibrated that includes a resonator, which is a superconducting circuit, and performs parametric oscillation so that the input signal is output from a signal generator connected to the resonator via a transmission path while sweeping a frequency or a power of this input signal;
a measurement distribution data acquisition unit configured to acquire distribution data of an intensity of a reflection signal based on measurement of the intensity of the reflection signal from the oscillator in response to the input signal;
a theoretical distribution data acquisition unit configured to acquire the distribution data of the intensity of the reflection signal that has been theoretically obtained, a value of a degree of signal loss of the transmission path being assumed in the distribution data; and
an estimation unit configured to estimate the degree of the signal loss by comparing the distribution data acquired by the measurement distribution data acquisition unit with the distribution data acquired by the theoretical distribution data acquisition unit.

A program according to a third aspect of the present disclosure causes a computer to execute the following steps of:
an input signal control step for controlling an input signal to be input to an oscillator to be calibrated that includes a resonator, which is a superconducting circuit, and performs parametric oscillation so that the input signal is output from a signal generator connected to the resonator via a transmission path while sweeping a frequency or a power of this input signal;
a measurement distribution data acquisition step for acquiring distribution data of an intensity of a reflection signal based on measurement of the intensity of the reflection signal from the oscillator in response to the input signal;
a theoretical distribution data acquisition step for acquiring the distribution data of the intensity of the reflection signal that has been theoretically obtained, a value of a degree of signal loss of the transmission path being assumed in the distribution data; and an estimation step for estimating the degree of the signal loss by comparing the distribution data acquired in the measurement distribution data acquisition step with the distribution data acquired in the theoretical distribution data acquisition step.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

Figure 1:
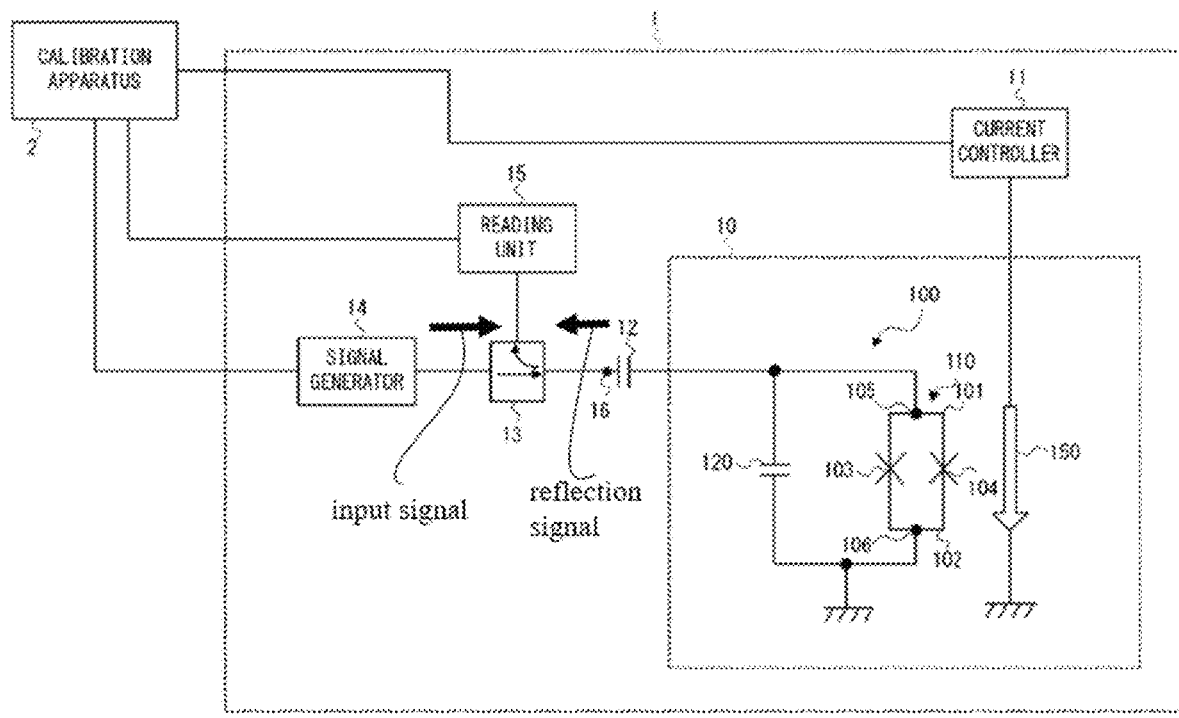
FIG. 1 is a schematic view showing one example of a configuration of a calibration apparatus and an oscillation device to be calibrated according to an example embodiment.

Prior to giving the description of example embodiments, first, a problem in the present disclosure will be described.

As described above, solving the combinatorial optimization problem can be replaced by obtaining the state of each spin in which the Hamiltonian of the Ising model becomes a minimum. The Hamiltonian H of the Ising model can be expressed by the following Expression (1).

$$H = \sum_{i<j} J_{ij}\sigma_i\sigma_j \quad (1)$$

In the above expression, $\sigma_i$ and $\sigma_j$ respectively represent the i-th spin and the j-th spin, and have a value +1 when the spin is an upward state and have a value −1 when the spin is a downward state. Further, $J_{ij}$ represents a coupling constant indicating the intensity of the interaction between the i-th spin and the j-th spin. When the combinatorial optimization problem to be solved is mapped to the Ising model, the value of $J_{ij}$ is determined for all the i and j. Then by finding $\sigma_i$ and $\sigma_j$ in which the Hamiltonian H of the Ising model having these becomes a minimum, the solution of the optimization problem can be obtained.

As described above, in order to map the optimization problem to be solved to the Ising model, it is required to determine $J_{ij}$ for all the i and j in accordance with the problem. Since $J_{ij}$ is determined, all the coupling intensities between the quantum bits are determined in the quantum annealing circuit. Therefore, in order to solve the optimization problem in a quantum annealing circuit, first, it is required to set all the coupling intensities between the quantum bits in accordance with the problem. In order to increase the accuracy of the solution, it is required to set the coupling intensities as accurately as possible.

In the scheme disclosed in the document Puri, that is, in the quantum annealing circuit in which the LHZ scheme and the Josephson parametric oscillator are combined with each other, $|J_{ij}|$ is proportional to the power $P_{in}$ of the input signal (second AC signal) in the input node of the oscillator. Therefore, in order to set a desired $|J_{ij}|$, it is sufficient that an input signal having a power $P_{in}$ that corresponds to the desired $|J_{ij}|$ be supplied to an input node. However, as described above, since a power loss is generated from the signal generator to the input node of the oscillator and the amount of this power loss is unknown, there is a problem that it is difficult to accurately supply the input signal with an appropriate power to the input node. In order to solve this problem, the present disclosure discloses a technique of estimating a degree of signal loss of the input signal to be supplied to the oscillator.

In the following, the details of example embodiments will be described. A resonator according to the example embodiments is, for example, a superconducting circuit obtained by a line (wire) formed by a superconductor on a silicon substrate. For example, while Nb (niobium) or Al (aluminum) is, for example, used as a material of this line, any other metal such as Mo (molybdenum) or Ta (tantalum) which is in a superconducting state when it is cooled to an extremely low temperature may be used. Further, in order to achieve the superconducting state, a circuit of the resonator is used in a temperature environment such as 10 mK (milli-Kelvin) achieved in a freezer.

Further, in the following description, the Josephson junction indicates an element including a structure in which a thin insulating film is sandwiched between a first superconductor and a second superconductor.

First Example Embodiment

FIG. 1 is a schematic view showing one example of a configuration of a calibration apparatus 2 and an oscillation device 1 to be calibrated. As shown in FIG. 1, the oscillation device 1 includes an oscillator 10, a current controller 11, a capacitor 12, a circulator 13, a signal generator 14, and a reading unit 15. The oscillator 10, which is a circuit that is used as quantum bits, is referred to as a superconducting non-linear oscillator, a Josephson parametric oscillator or the like.

The oscillator 10 includes a resonator 100 and a magnetic field generator 150. The resonator 100 includes a loop circuit 110 and a capacitor 120. The loop circuit 110 includes a first superconducting line 101 that connects a first Josephson junction 103 and a second Josephson junction 104 and a second superconducting line 102 that connects the first Josephson junction 103 and the second Josephson junction 104. In other words, the resonator 100 includes the loop circuit 110 in which the first superconducting line 101 and the second superconducting line 102 are joined together by the first Josephson junction 103 and the second Josephson junction 104, and the capacitor 120. As shown in FIG. 1, the first superconducting line 101, the first Josephson junction 103, the second superconducting line 102, and the second Josephson junction 104 are connected in a ring shape, thereby forming the loop circuit 110. In other words, in the loop circuit 110, the first superconducting line 101 and the second superconducting line 102 are joined together by the first Josephson junction 103 and the second Josephson junction 104, thereby forming a loop. That is, it can also be said that the loop circuit 110 is a DC-SQUID (superconducting quantum interference device).

The loop circuit 110 is shunted by the capacitor 120. That is, a first part 105 in the first superconducting line 101 and a second part 106 in the second superconducting line 102 are shunted by the capacitor 120. In other words, input/output end parts of the DC-SQUID of the resonator 100 are shunted by the capacitor 120. That is, it can be said that the capacitor 120 and the loop circuit 110 are connected in a ring shape, whereby a loop circuit that incorporates the loop circuit 110 on a loop line is formed. The first part 105 is a desired part of the first superconducting line 101. That is, the position of the first part 105 in the first superconducting line 101 is not particularly limited. Likewise, the second part 106 is a desired part of the second superconducting line 102. That is, the position of the second part 106 in the second superconducting line 102 is not particularly limited.

While the resonator 100, which is the loop circuit composed of the loop circuit 110 and the capacitor 120 connected in a ring shape, is used as one example of the oscillator in the configuration shown in FIG. 1, a resonator having another configuration may be used as the oscillator. For example, the loop circuit that forms a resonator may further include other circuit elements. That is, it is sufficient that the resonator be a loop circuit composed of at least the loop circuit 110 and the capacitor 120 connected in a ring shape. As shown in FIG. 1, one end of the loop circuit in which the loop circuit 110 and the capacitor 120 are connected in a ring shape may be grounded.

The magnetic field generator 150 and the loop circuit 110 are magnetically coupled to each other via a mutual inductance. In other words, the magnetic field generator 150 and the loop circuit 110 are inductively coupled to each other. The magnetic field generator 150 is a circuit that generates an AC magnetic field and applies the AC magnetic field to the loop circuit 110. The magnetic field generator 150, which is a circuit through which an AC current flows, generates the AC magnetic field by this AC current. More specifically, a current in which the DC current and the AC current overlap with each other flows through the magnetic field generator 150. The frequency of the generated AC magnetic field is equal to the frequency of the AC current. The magnitude of the magnetic flux and that of the oscillation frequency (the resonance frequency) are controlled by the magnitude of the DC current. The resonance frequency of the resonator 100, that is, the oscillation frequency of the oscillator 10, depends on the equivalent inductance of the loop circuit 110. This equivalent inductance depends on the magnitude of the magnetic flux that penetrates through the loop of the loop circuit 110. The magnitude of the magnetic flux that penetrates through the loop depends on the magnitude of the DC current that flows through the magnetic field generator 150. Therefore, as described above, the magnitude of the oscillation frequency (the resonance frequency) is controlled by the magnitude of the DC current. While the magnetic field generator 150 is shown by one wire in FIG. 1, it may be composed of two wires in which the DC current is made to flow through one wire and the AC current is made to flow through the other wire.

When an AC magnetic field having the frequency twice as large as the resonance frequency of the resonator 100 is applied to the loop circuit 110 by causing an AC current to flow through the magnetic field generator 150, the oscillator 10 is oscillated at this resonance frequency (i.e., an oscillation frequency 0.5 times as large as the frequency of the AC magnetic field). This oscillation is called parametric oscillation. That is, the oscillator 10 is a circuit that performs parametric oscillation. The oscillation state at the time of parametric oscillation may be one of a first oscillation state and a second oscillation state whose phases of vibrations are different from each other by $\pi$. The oscillator 10 indicates quantum bits depending on the oscillation state. In other words, the first oscillation state and the second oscillation state correspond to quantum bits 0 and 1.

The current controller 11, which is a circuit connected to the magnetic field generator 150 of the oscillator 10, supplies a DC current for controlling the oscillation frequency of the oscillator 10 and the AC current for oscillating the oscillator 10 to the magnetic field generator 150. The current controller 11 supplies the current in accordance with the control by the calibration apparatus 2.

The oscillator 10 is connected to the circulator 13 via the capacitor 12. The capacitor 12 is connected to the loop circuit in which the loop circuit 110 and the capacitor 120 are connected in a ring shape in the oscillator 10. The capacitor 12 is arranged in an extremely low temperature environment, like the oscillator 10. The input node 16 is a node to which the input signal to the oscillator 10 is input. Since a part from the input node 16 to the oscillator 10 is composed of a superconducting material, it can be said that there is no signal loss from the input node 16 to the oscillator 10. Specifically, in this example embodiment, the input node 16 is a terminal which is on the side of the circulator 13 (the signal generator 14) of the capacitor 12.

While the circulator 13 is provided in an extremely low temperature environment in this example embodiment, it may be provided in a temperature environment higher than the extremely low temperature. The circulator 13 is a circuit to which the signal generator 14 and the reading unit 15 placed in a room temperature environment are connected, besides the aforementioned capacitor 12 (the input node 16), and is a circuit that controls the signal flow. Specifically, the circulator 13 outputs a signal from the signal generator 14 to the input node 16. Further, the circulator 13 outputs a signal from the input node 16 (a reflection signal reflected from the oscillator 10) to the reading unit 15. In the configuration shown in FIG. 1, the circulator 13 is connected to the loop circuit in which the loop circuit 110 and the capacitor 120 are connected in a ring shape via the capacitor 12 (the input node 16).

The signal generator 14 is a circuit that is connected to the resonator 100 via a transmission path and outputs an input signal to be supplied to the resonator 100 (the oscillator 10). Specifically, the input signal is a signal in which the first AC signal and the second AC signal overlap with each other. The first AC signal and the second AC signal, which are high-frequency AC voltages, may be called microwaves. The first AC signal is a probe signal for measuring the intensity of the reflection signal of the resonator 100 and the second AC signal is a signal for exciting the resonator 100 from a ground state to a first excited state. The signal generator 14 outputs the input signal in accordance with the control by the calibration apparatus 2.

The reading unit 15 is a circuit configured to read out the internal state of the oscillator 10, that is, the oscillation state. In this example embodiment, the reading unit 15 measures the intensity of the reflection signal from the oscillator 10 (specifically, for example, an S parameter (S11), a reflection coefficient, a voltage, or a power etc.) The reading unit 15 outputs the measurement value of the intensity of the reflection signal to the calibration apparatus 2. In the following description, the intensity of the reflection signal may be referred to as a reflection intensity.

Figure 2:
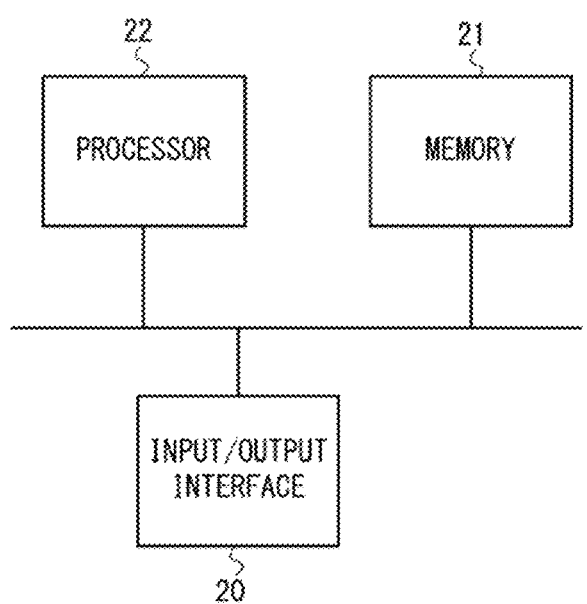
FIG. 2 is a schematic view showing one example of a hardware configuration of the calibration apparatus according to this example embodiment.
Figure 3:
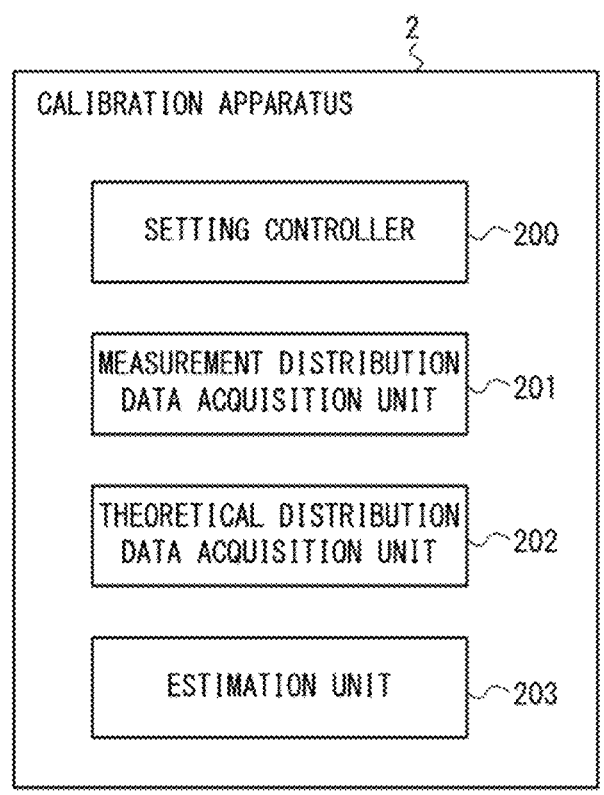
FIG. 3 is a block diagram showing one example of a functional configuration of the calibration apparatus according to this example embodiment.

Next, a configuration of the calibration apparatus 2 will be described. FIG. 2 is a schematic view showing one example of a hardware configuration of the calibration apparatus 2. Further, FIG. 3 is a block diagram showing one example of a functional configuration of the calibration apparatus 2.

As shown in FIG. 2, the calibration apparatus 2 includes an input/output interface 20, a memory 21, and a processor 22.

The input/output interface 20 is used to communicate with another circuit or apparatus. In this example embodiment, the input/output interface 20 is used to communicate with the current controller 11, the signal generator 14, and the reading unit 15.

The memory 21 is composed, for example, of a combination of a volatile memory and a nonvolatile memory. The memory 21 is used to store software (a computer program) including one or more instructions executed by the processor 22, data used for various processing of the calibration apparatus 2 and the like.

The processor 22 performs processing of each of the components shown in FIG. 3 by loading the software (computer program) from the memory 21 and executing the loaded software. The processor 22 may be, for example, a microprocessor, a Micro Processor Unit (MPU), a Central Processing Unit (CPU) or the like. The processor 22 may include a plurality of processors.

The aforementioned program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program(s) may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

As shown in FIG. 3, the calibration apparatus 2 includes a setting controller 200, a measurement distribution data acquisition unit 201, a theoretical distribution data acquisition unit 202, and an estimation unit 203. The setting controller 200 is also referred to as an input signal controller.

The setting controller 200 controls the current controller 11 and the signal generator 14. Specifically, the setting controller 200 controls the resonance frequency of the resonator 100 (the oscillation frequency of the oscillator 10) in such a way that the value thereof is set to a predetermined value. That is, the setting controller 200 sets the resonance frequency by setting the magnitude of the DC current supplied to the magnetic field generator 150.

Further, the setting controller 200 sets the frequency and the power of the input signal for the signal generator 14 and controls the input signal output from the signal generator 14. In particular, the setting controller 200 performs the following control for the calibration. The setting controller 200 controls the input signal to be input to the oscillator 10 to be calibrated so that this input signal is output from the signal generator 14 while sweeping the frequency or the power of this input signal.

The measurement distribution data acquisition unit 201 acquires distribution data of the intensity of the reflection signal based on the measurement of the intensity of the reflection signal from the oscillator 10 in response to the input signal. Specifically, the measurement distribution data acquisition unit 201 acquires the distribution data of the reflection intensity from the reading unit 15. The distribution data is data indicating the distribution of the reflection intensity when the frequency or the power is changed for the input signal.

The theoretical distribution data acquisition unit 202 acquires distribution data of the intensity of the reflection signal that has been theoretically obtained, the distribution data being the one in which the value of the degree of the signal loss of the transmission path (specifically, the transmission path from the signal generator 14 to the input node 16) has been assumed. Specifically, the theoretical distribution data acquisition unit 202 acquires the distribution data of the theoretical value of the reflection intensity specified in accordance with the average number of photons accumulated in the resonator 100 when the second AC signal of a power $P_{in}$ is input to the resonator 100 and the difference between the frequency of the first AC signal and the resonance frequency. The power $P_{in}$, which is specified by the power P of the second AC signal output from the signal generator 14 and a degree of signal loss A (A represents a coefficient (0<A<1) indicating the degree of the signal loss, and the smaller this value becomes, the larger the degree of the signal loss becomes), is expressed as $P_{in}$=PA. That is, the theoretical distribution data acquisition unit 202 acquires the distribution data of the theoretical value of the reflection intensity specified in accordance with the average number of photons accumulated when the second AC signal of the power $P_{in}$ that corresponds to the assumed value of the degree of the signal loss is input and the difference between the frequency of the first AC signal and the resonance frequency. That is, the theoretical distribution data acquisition unit 202 acquires, not the distribution data actually measured, distribution data generated by a simulation. The theoretical distribution data acquisition unit 202 acquires various kinds of distribution data that correspond to various degrees of signal loss. The theoretical distribution data acquisition unit 202 may acquire the distribution data of the theoretical value calculated by another apparatus or may acquire distribution data of the theoretical value calculated by the calibration apparatus 2.

The estimation unit 203 estimates the degree of the signal loss by comparing the distribution data acquired by the measurement distribution data acquisition unit 201 with the distribution data acquired by the theoretical distribution data acquisition unit 202. Specifically, as will be described later, the estimation unit 203 compares the reflection intensity in accordance with the frequency of the first AC signal and the power of the second AC signal with the reflection intensity in accordance with the frequency of the first AC signal and the average number of photons accumulated in the resonator 100.

Next, a method of estimating the degree of the signal loss according to this example embodiment will be described.

In this example embodiment, the transmission path from the signal generator 14 to the input node 16 is extremely long (e.g., an order of meter) and besides a cable and the circulator 13, a plurality of high-frequency components such as connectors are provided in this transmission path. Further, the temperature of the transmission path is changed from the room temperature (about 300 K) to an extremely low temperature (about 10 mK). Therefore, it is difficult to directly measure the loss from the signal generator 14 to the input node 16. Therefore, in this example embodiment, the estimation of the loss is performed as follows.

The setting controller 200 sets the resonance frequency of the resonator 100 to a specific frequency $f_0$. It is assumed that the relation between the resonance frequency of the resonator 100 and the DC current supplied to the magnetic field generator 150 is known in advance by an experiment. Further, the setting controller 200 sets the frequency of the second AC signal to a value equal to the resonance frequency $f_0$ of the resonator 100. Then the setting controller 200 changes the power of the second AC signal or the frequency of the first AC signal and the reading unit 15 measures how the intensity of the reflection signal reflected from the oscillator 10 is changed. That is, the setting controller 200 performs control so as to sweep the input signal. When the sweeping of the input signal is performed, the frequency of the second AC signal is fixed to the resonance frequency $f_0$ and the power of the first AC signal is also fixed to a specific value.

Figure 4A:
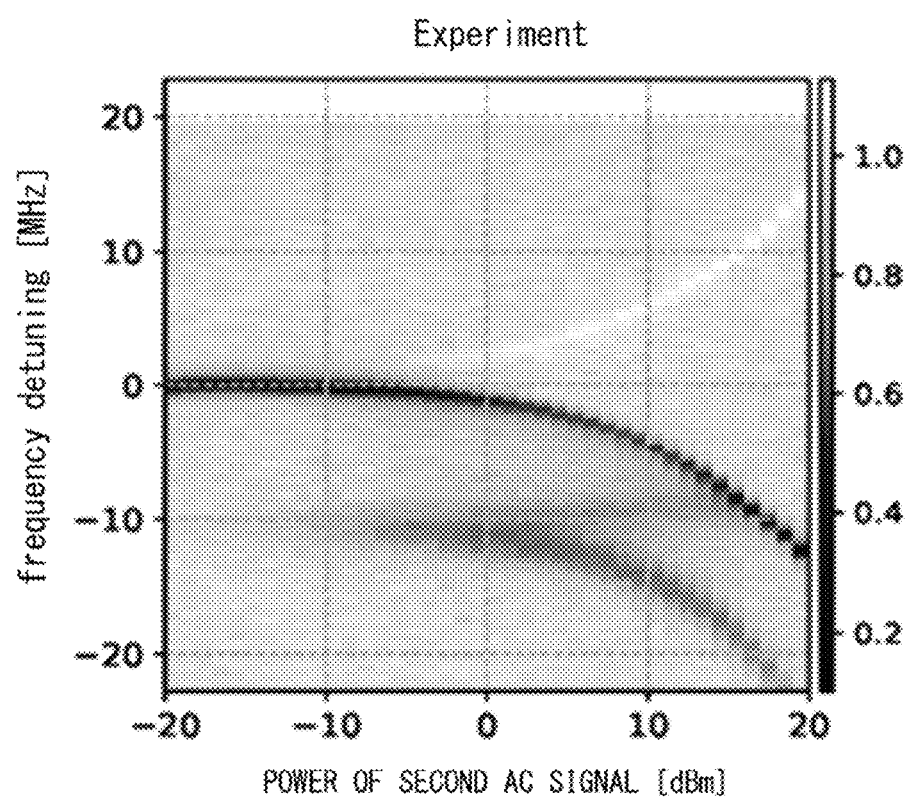
FIG. 4A is one example of a graph in which reflection intensities measured by an experiment in which sweeping of an input signal is performed are plotted.

FIG. 4A is one example of a graph in which reflection intensities measured by an experiment in which sweeping of the input signal is performed are plotted. That is, FIG. 4A is one example of the distribution data acquired by the measurement distribution data acquisition unit 201. The horizontal axis of the graph shown in FIG. 4A indicates the power P of the second AC signal (power set by the setting controller 200) and the unit is dBm. The vertical axis of the graph shown in FIG. 4A indicates the difference between the frequency f of the first AC signal and the resonance frequency $f_0$ of the resonator 100 and the unit is MHz. This difference is called detuning. The detuning Δ can be expressed by the expression $Δ=f-f_0$. Thus, in the graph shown in FIG. 4A, for example, Δ=0 indicates that the frequency f of the first AC signal is equal to the resonance frequency $f_0$ of the resonator 100. Further, Δ>0 indicates that f is higher than $f_0$ and Δ<0 indicates that f is lower than $f_0$. Then the shading in the graph shown in FIG. 4A indicates the magnitude of the intensity of the reflection signal reflected from the oscillator 10. As indicated in a legend on the right side of a rectangular plot area in FIG. 4A, as the color becomes darker, the reflection intensity becomes weaker, whereas as the color becomes lighter, the reflection intensity becomes stronger. As described above, the reflection intensity may be an absolute value of S11, which is an S parameter, or may be a voltage or a power. That is, any kind of value may be used as long as the intensity of the reflection signal is indicated by this value. As will be understood from the results of the measurement shown in the graph in FIG. 4A, the intensity of the reflection signal reflected from the oscillator 10 is changed depending on the power of the second AC signal and the frequency of the first AC signal.

Figure 4B:
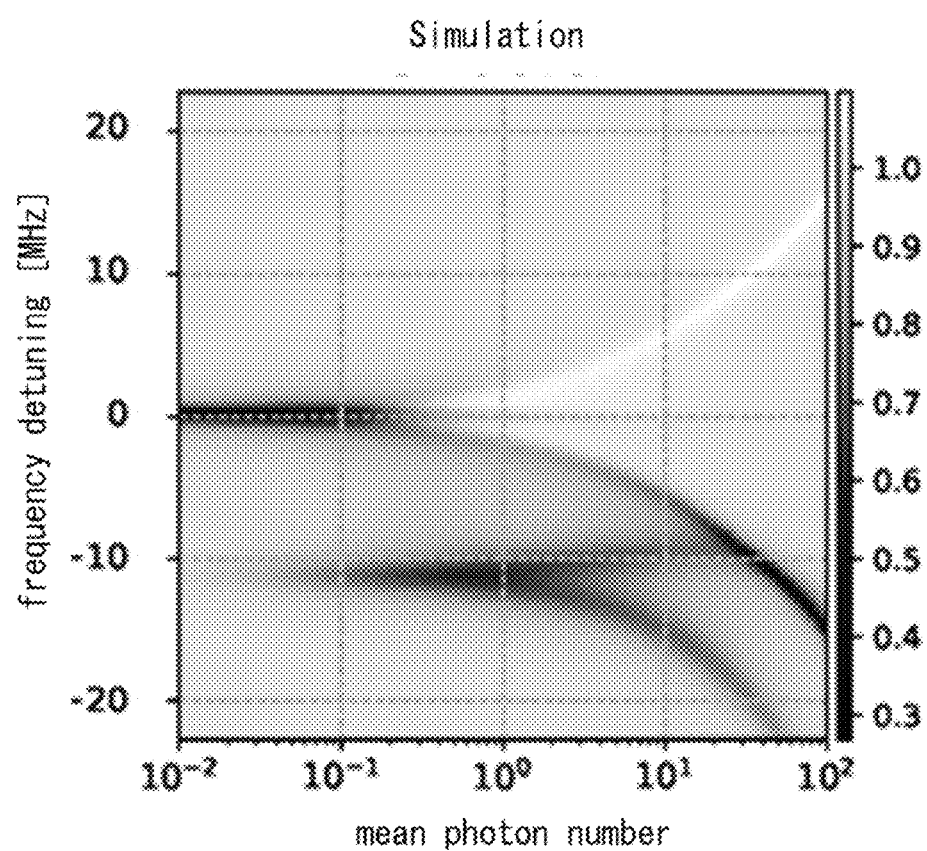
FIG. 4B is one example of a graph in which reflection intensities that have been theoretically obtained are plotted.

On the other hand, FIG. 4B is one example of a graph in which reflection intensities that have been theoretically obtained are plotted. That is, FIG. 4B, which is distribution data obtained by a simulation, is one example of the distribution data that the theoretical distribution data acquisition unit 202 acquires. The graph (distribution data) shown in FIG. 4B is a graph (distribution data) in a case in which a value that substantially coincides with the actual value of the degree of the signal loss is assumed as a value of the degree of the signal loss. The vertical axis of the graph shown in FIG. 4B is the same as the vertical axis of the graph shown in FIG. 4A. Further, the shading in the graph shown in FIG. 4B indicates the intensity of the reflection signal, like in the graph shown in FIG. 4A. The horizontal axis shown in FIG. 4B is the average number of photons accumulated in the resonator 100. As shown in Expression (2) that will be described below, the average number of photons accumulated in the resonator 100 is proportional to the power of the second AC signal actually supplied to the oscillator 10. Therefore, the average number of photons accumulated in the resonator 100 corresponds to the power P of the second AC signal (power set by the setting controller 200). Since it is theoretically known how the intensity of the reflection signal of the oscillator 10 is changed depending on the average number of photons accumulated in the resonator 100 and the frequency of the first AC signal, the distribution data shown in FIG. 4B is obtained separately from the results of the measurement (FIG. 4A).

As described above, the power of the signal input to the oscillator 10 is PA. That is, when the second AC signal having a power value P has been supplied to the oscillator 10 from the signal generator 14 at a room temperature, the second AC signal having a power value PA is actually supplied to the oscillator 10. As described above, the power value PA of the second AC signal supplied to the oscillator 10 and the average number of photons <n> accumulated in the resonator 100 are proportional to each other. Specifically, the following relational expression shown in Expression (2) is established.

$$PA \propto \langle n \rangle \hbar \frac{\omega_0^2}{Q} \quad (2)$$

Here,
$\hbar$
is a value obtained by dividing the Planck's constant h by $2\pi$. Further, Q is a Q value of the resonator 100, and a specific value is specified by an experiment or the like in advance. Further, $\omega_0$, which is a resonant angular frequency of the resonator 100, is expressed by the following Expression (3). Since $f_0$ is a known value set by the setting controller 200, $\omega_0$ is also a known value.

$$\omega_0 = 2\pi f_0 \quad (3)$$

Since the relation shown in Expression (2) has been established, when an appropriate degree of signal loss A (that is, actual degree of signal loss A) is assumed, the graph (distribution data) based on the measurement and the theoretical graph (distribution data) become the same. Therefore, by finding such a degree of signal loss A, the actual degree of signal loss A can be estimated. In the following, the details of the estimation of the degree of the signal loss will be described.

As will be understood from Expression (2), assuming the degree of the signal loss A is equal to assuming the average number of photons <n> (the horizontal axis of the graph shown in FIG. 4B). Therefore, when the value of the degree of the signal loss A is changed, the value of the average number of photons <n> is changed. Accordingly, when the value of the degree of the signal loss A is changed, in the graph shown in FIG. 4B, the minimum value and the maximum value in the horizontal axis are changed. This will be explained in further detail. As described above, the horizontal axis of the graph based on the measurement (the graph shown in FIG. 4A) is the power P of the second AC signal in the signal generator 14. Thus, in the graph based on the measurement, the minimum value and the maximum value of the horizontal axis P are the minimum value and the maximum value of the power P of the second AC signal output from the signal generator 14 at the time of measurement. On the other hand, since the range in which the power P is swept is known (that is, since the minimum value and the maximum value of the power P at the time of measurement are known), by assuming the value of the degree of the signal loss A from the relation shown in Expression (2), the minimum value and the maximum value of the average number of photons <n> can be calculated. That is, the minimum value and the maximum value in the horizontal axis of the theoretical graph (the graph shown in FIG. 4B) can be calculated. Then by plotting the reflection intensities that have been theoretically obtained for a range from the minimum value to the maximum value of the average number of photons, the theoretical graph is obtained. In this way, a change in the value of the degree of the signal loss A causes a change in a range of values in the horizontal axis to be plotted in the theoretical graph. In other words, when the value of the degree of the signal loss A is changed, the data range of the theoretical distribution data (more specifically, the data range regarding the average number of photons) compared with the distribution data based on the measurement is changed.

The estimation unit 203 compares the graph (distribution data) based on the measurement with the theoretical graph (distribution data) in which the degree of the signal loss is assumed. In this comparison, the graph (distribution data) of the reflection intensity in a range from the minimum value to the maximum value of the power P at the time of measurement is compared with the graph (distribution data) of the reflection intensity in a range from the minimum value to the maximum value of the average number of photons defined by the assumed degree of signal loss. Then the estimation unit 203 determines whether or not it can be regarded that they are the same by comparing them. That is, the estimation unit 203 determines whether the difference between them is equal to or smaller than a predetermined difference. The estimation unit 203 calculates the difference between them using, for example, a known data comparison method such as the least-squares method. The estimation unit 203 estimates the assumed value of the degree of the signal loss when the difference between them is equal to or smaller than a predetermined difference as an actual value of the degree of the signal loss. Therefore, the estimation unit 203 finds the assumed value of the degree of the signal loss in which the difference between them becomes equal to or smaller than a predetermined difference by repeating the comparison between the distribution data based on the measurement and various kinds of theoretical distribution data having assumed degrees of signal loss different from one another. Then the estimation unit 203 estimates the thus obtained assumed value to be the actual value of the degree of the signal loss (i.e., a true value).

Figure 5:
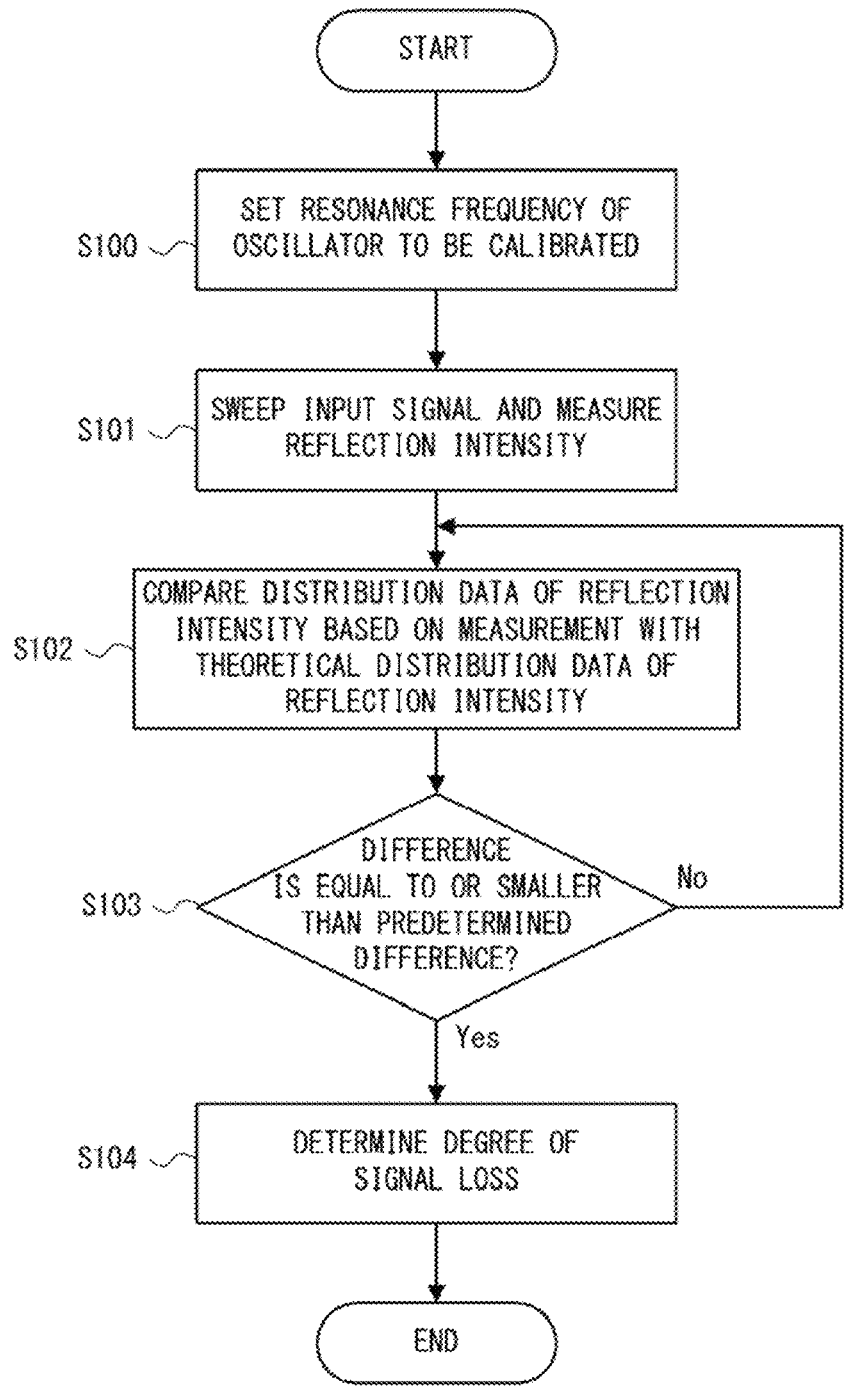
FIG. 5 is a flowchart showing one example of an operation of estimating a degree of signal loss according to a first example embodiment.

Next, a flow of the operation of estimating the degree of the signal loss according to this example embodiment will be described. FIG. 5 is a flowchart showing one example of the operation of estimating the degree of the signal loss according to the first example embodiment. In the following, descriptions will be given with reference to FIG. 5.

In Step S100, the setting controller 200 sets the resonance frequency of the oscillator 10 to be calibrated. In this example, the resonance frequency set in the oscillator 10 to be calibrated is denoted by $f_0$.

In Step S101, the sweeping of the input signal and the measurement of the reflection intensity are performed. That is, the setting controller 200 controls the input signal to be input to the oscillator 10 to be calibrated so that this signal is output from the signal generator 14 by sweeping this input signal. Further, the distribution data of the reflection intensity measured by the reading unit 15 is acquired by the measurement distribution data acquisition unit 201.

While the frequency and the power of the input signal (specifically, the power of the second AC signal and the frequency of the first AC signal) are changed, for example, in a predetermined range in the sweeping of the input signal, only one of the power and the frequency may be changed in a predetermined range. Preferably, both the power and the frequency are swept so that more pieces of data can be collected.

Further, the range of the frequency of the first AC signal in the distribution data preferably includes the resonance frequency of the oscillator 10 to be calibrated or a frequency in the vicinity thereof. Specifically, at the time of measurement, for example, the range of the frequency of the first AC signal preferably includes a frequency that belongs to a frequency band 0.9 times to 1.1 times larger than the resonance frequency of the oscillator 10 to be calibrated. This is due to the following reason. It is clear from FIG. 4A that, when the detuning Δ (the vertical axis in the graph) is zero or in the vicinity of zero, a change in the power of the second AC signal (the horizontal axis in the graph) causes a change in the reflection intensity from the oscillator 10. On the other hand, when detuning Δ is, for example, +20 MHz, even when the power of the second AC signal is changed, the reflection intensity is hardly changed. That is, characteristic distribution data cannot be obtained. Therefore, when the reflection intensity whose detuning Δ is +20 MHz is focused on, it is not easy to estimate the degree of the signal loss by comparing the distribution data based on the measurement with the theoretical distribution data. Therefore, the range of the frequency of the first AC signal preferably includes a resonance frequency of the oscillator 10 to be calibrated or a frequency in the vicinity thereof in such a way that the characteristic distribution data can be obtained.

From Step S102 to Step S103, the estimation of the degree of the signal loss is performed by the estimation unit 203. As described above, the degree of the signal loss may be estimated using distribution data when both the frequency and the power have been changed or it may be estimated using distribution data when one of the frequency and the power has been changed.

In Step S102, the estimation unit 203 compares the distribution data obtained by the measurement with the distribution data theoretically obtained in which the degree of the signal loss is assumed.

In Step S103, the estimation unit 203 determines whether or not the difference between them is equal to or smaller than a predetermined difference. That is, the estimation unit 203 determines whether or not it can be regarded that both of them coincide with each other. When they do not coincide with each other, the process goes back to Step 102, where the distribution data in which another value is assumed as a value of the degree of the signal loss is compared with the distribution data obtained by the measurement. On the other hand, when it can be regarded that both of them coincide with each other, in Step S104, the estimation unit 203 determines the value of the degree of the signal loss assumed in the distribution data to be compared to be the actual value of the degree of the signal loss.

The first example embodiment has been described above. According to this example embodiment, the value of the degree of the signal loss is estimated. That is, it is possible to specify the signal loss amount in the transmission path. It is therefore possible to accurately supply the second AC signal having a desired power to the input node 16. Thus, $J_{ij}$ in Expression (1) can be implemented by hardware more appropriately. That is, when the estimated degree of signal loss is denoted by A and the power of the second AC signal that corresponds to $J_{ij}$ is denoted by $P_{in}$, the setting controller 200 is able to appropriately implement $J_{ij}$ by hardware by controlling the second AC signal having power $P_{in}/A$ in such a way that it is output from the signal generator 14.

Second Example Embodiment

In the first example embodiment, an embodiment in which a calibration is performed without taking into account a connection between the oscillator 10 to be calibrated and another oscillator has been described. In this example embodiment, a calibration in which the connection between the oscillator 10 to be calibrated and another oscillator is taken into account will be described.

Figure 6:
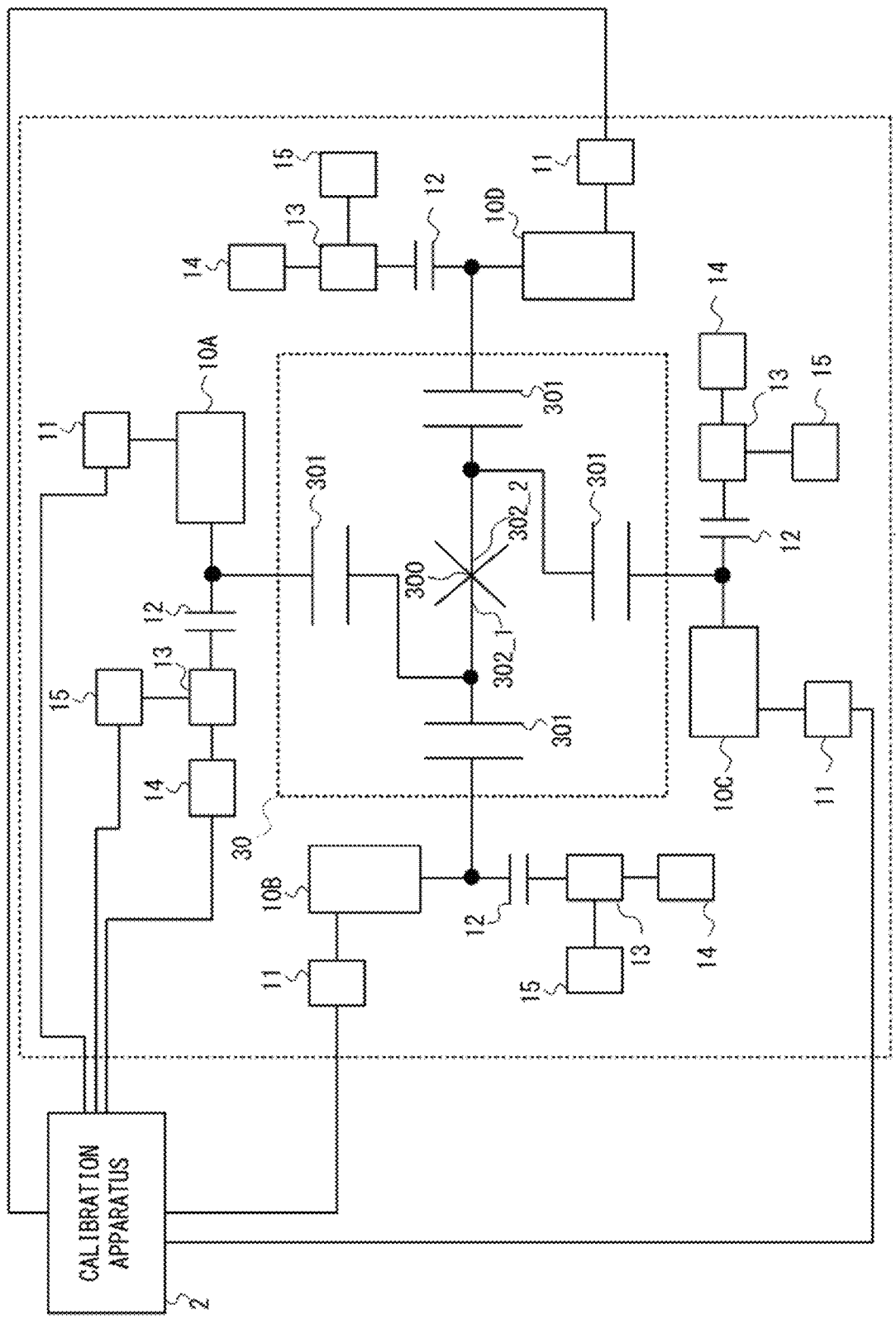
FIG. 6 is a schematic view showing one example of a quantum annealing circuit.

FIG. 6 is a schematic view showing one example of a quantum annealing circuit. FIG. 6 shows, as one example, a quantum annealing circuit 3 including four oscillators 10. In FIG. 6, symbols 10A, 10B, 10C, and 10D are used in order to differentiate these four oscillators 10. FIG. 6 shows, besides the quantum annealing circuit 3, the aforementioned calibration apparatus 2 as well. In the following description, a case in which a calibration for the oscillator 10A is performed will be described as an example. Further, the oscillators 10A, 10B, 10C, and 10D are referred to as an oscillator 10 when it is not necessary to differentiate them.

In the quantum annealing circuit 3 shown in FIG. 6, four oscillators 10 are connected by one coupling circuit 30. More specifically, the coupling circuit 30 is connected to circuits provided between the oscillator 10 and the capacitor 12. As described above with reference to FIG. 1, the current controller 11 is connected to each of the oscillators 10. That is, the current controller 11 is connected to the magnetic field generator 150 of the oscillator 10. The calibration apparatus 2 is connected to each of the current controllers 11 in order to set the resonance frequency of the oscillator 10. Further, the signal generator 14 and the reading unit 15 are connected to the capacitor 12 connected to each of the oscillators 10 via the circulator 13. Further, the calibration apparatus 2 is connected to the signal generator 14 and the reading unit 15 that correspond to the oscillator 10A in order to perform the estimation of the degree of the signal loss.

In the configuration example shown in FIG. 6 as one example, the coupling circuit 30, which is a circuit that couples the four oscillators 10, is composed of one Josephson junction 300 and four capacitors 301. The coupling circuit 30 couples a first set of oscillators (the oscillators 10A and 10B) composed of two oscillators 10 among the four oscillators 10 to a second set of oscillators (the oscillators 10C and 10D) composed of the other two oscillators 10 via the Josephson junction 300. Each of the first set of oscillators (the oscillators 10A and 10B) is connected to a superconductor 302_1 via the capacitor 301. Further, each of the second set of oscillators (oscillators 10C and 10D) is connected to a superconductor 302_2 via the capacitor 301. Here, the superconductor 302_1 is a wire connected to one terminal of the Josephson junction 300 and the superconductor 302_2 is a wire connected to the other terminal of the Josephson junction 300. That is, it can be said that the superconductor 302_1 and the superconductor 302_2 are joined together by the Josephson junction 300.

That is, the first oscillator 10 (oscillator 10A) of the first set of oscillators is connected to one terminal of the Josephson junction 300 via the first capacitor 301. Further, the second oscillator 10 (oscillator 10B) of the first set of oscillators is connected to one terminal of the Josephson junction 300 via the second capacitor 301. Likewise, the third oscillator 10 (oscillator 10C) of the second set of oscillators is connected to the other terminal of the Josephson junction 300 via the third capacitor 301. Further, the fourth oscillator 10 (oscillator 10D) of the second set of oscillators is connected to the other terminal of the Josephson junction 300 via the fourth capacitor 301.

Another coupling circuit composed of a combination of a Josephson junction and a capacitor may be used in place of the coupling circuit 30 shown in FIG. 6.

Figure 7:
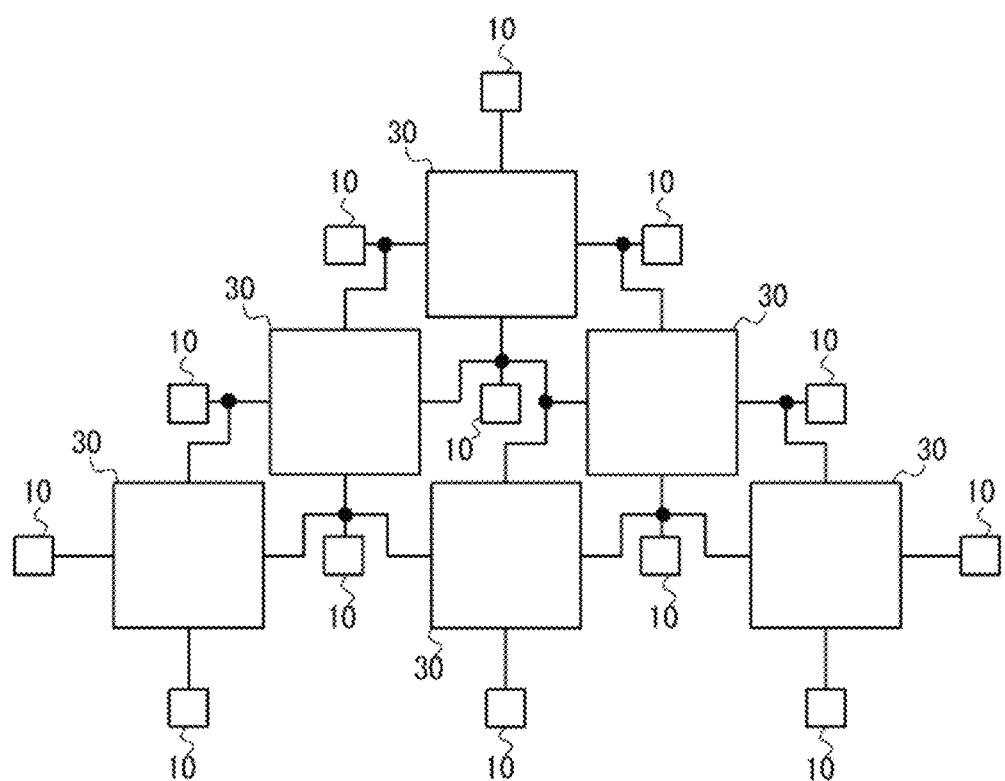
FIG. 7 is a schematic view showing a configuration of a quantum annealing circuit in which oscillators are integrated.

While the configuration of the quantum annealing circuit when the number of oscillators 10 is four is shown in the configuration shown in FIG. 6, a quantum annealing circuit in which a desired number of oscillators 10 are integrated can be obtained by aligning a plurality of unit structures and connecting them to one another, each of the unit structures having the configuration of the quantum annealing circuit 3 shown in FIG. 6. FIG. 7 shows a configuration example thereof. FIG. 7 is a schematic view showing a configuration of a quantum annealing circuit 4 in which the oscillators 10 are integrated. In the configuration shown in FIG. 7, as shown in FIG. 6, each of the coupling circuits 30 is connected to four oscillators 10. Then each of the oscillators 10 is connected to one to four coupling circuits 30, and the oscillators 10 are aligned so as to be shared by a plurality of unit structures, whereby unit structures, each of which being the one shown in FIG. 6, are aligned. In the quantum annealing circuit 4, at least one oscillator 10 is connected to the plurality of coupling circuits 30. In the example shown in FIG. 7, in particular, at least one oscillator 10 is connected to the four coupling circuits 30. Further, the quantum annealing circuit 4 can be described as follows. The quantum annealing circuit 4 includes the plurality of oscillators 10 and each of the oscillators 10 is connected to one to four coupling circuits 30. The number of coupling circuits 30 to which each of the oscillators 10 is connected corresponds to the number of unit structures this oscillator 10 is shared by. In this way, in the example shown in FIG. 7, the quantum annealing circuit 4 includes a plurality of unit structures and the oscillators 10 are shared by a plurality of unit structures. While 13 oscillators 10 are integrated in the example shown in FIG. 7, a desired number of oscillators 10 may be integrated in a similar method.

In FIG. 7, the current controller 11, the signal generator 14, the reading unit 15, the circulator 13, and the capacitor 12 are not shown in order to facilitate understanding of this drawing. Further, the operation principles and the control method of the quantum annealing circuit are disclosed in the document Puri and the operation principles and the control method disclosed in the document Puri are applied also in the quantum annealing circuits shown in FIGS. 6 and 7.

As described above, in the configuration in which the oscillator 10 to be calibrated and the other oscillators 10 are coupled to one another by the coupling circuit 30, the respective oscillators 10 are connected to one another. Therefore, if no measure is taken, some of the input signals supplied from the signal generator 14 to the oscillator 10 to be calibrated for the measurement of the reflection intensity are leaked to the other oscillators 10 connected to the oscillator 10 to be calibrated. Therefore, it is impossible to accurately estimate the degree of the signal loss.

In order to solve the above problem, in this example embodiment, when the input signal for measuring the reflection intensity is input to the oscillator 10 to be calibrated, the setting controller 200 sets the resonance frequency of the other oscillators 10 connected to the above oscillator 10 to a value different from the frequency of the input signal. Specifically, the resonance frequency of the other oscillators 10 is set to a frequency that is different from the frequency of the second AC signal. As described above, since the frequency of the second AC signal is set to the frequency the same as the resonance frequency of the oscillator 10 to be calibrated, it can also be said that the resonance frequency of the oscillator 10 to be calibrated and the resonance frequency of the other oscillators 10 are set to frequencies different from each other. The setting controller 200 sets the magnitude of the DC current supplied to the magnetic field generators 150 of the other oscillators 10, thereby setting the resonance frequency of the other oscillators 10 to a value that is different from the frequency of the input signal used at the time of measurement of the reflection intensity. In other words, the setting controller 200 sets the magnitude of the DC current supplied to each of the magnetic field generators 150, thereby setting the resonance frequency in such a way that the resonance frequency of the oscillator 10 to be calibrated becomes different from the resonance frequency of the other oscillators 10. Accordingly, the leakage of the input signal to the other oscillators 10 can be suppressed, whereby it is possible to estimate the degree of the signal loss more accurately.

The reason why the signal leakage can be prevented by adjusting the resonance frequency is because resonators typically include a function as filters that transmit only frequencies in the vicinity of the resonance frequency. That is, the above reason is because while signals having a frequency that is the same as the resonance frequency of the resonator 100 transmit through the resonator 100, almost all signals having frequencies different from the resonance frequency do not transmit through the resonator 100.

The oscillators 10 whose resonance frequency is set to a value different from that of the frequency of the second AC signal (resonance frequency of the oscillator 10 to be calibrated) may either be all the other three oscillators 10 connected to the oscillator 10 to be calibrated via the coupling circuit 30 or may be some of them. For example, the resonance frequency of only the oscillator 10 connected to the oscillator 10 to be calibrated without using the Josephson junction 300 among the oscillators 10 connected to the oscillator 10 to be calibrated may be set to a value that is different from the frequency of the second AC signal. That is, it is sufficient that the resonance frequency of the oscillator 10B other than the oscillator 10A to be calibrated of the first set of oscillators (the oscillators 10A and 10B) be set to a value different from that of the frequency of the second AC signal. This is because the Josephson junction 300 includes a function as a filter, which prevents signals from being transmitted through the Josephson junction 300. That is, even when the resonance frequency of the other oscillators 10C and 10D connected to the oscillator 10A to be calibrated via the Josephson junction 300 is the same as the frequency of the second AC signal, the signal leakage to the other oscillators 10C and 10D is prevented. However, in order to further prevent the signal leakage, the resonance frequency of all the other oscillators 10B, 10C, and 10D connected to the oscillator 10A to be calibrated via the coupling circuit 30 is preferably set to a value different from that of the frequency of the second AC signal. That is, the resonance frequency of the oscillator 10B other than the oscillator 10A to be calibrated among the first set of oscillators (the oscillators 10A and 10B) and the resonance frequency of the oscillators 10C and 10D included in the second set of oscillators are preferably set to a value different from that of the frequency of the second AC signal.

Figure 8:
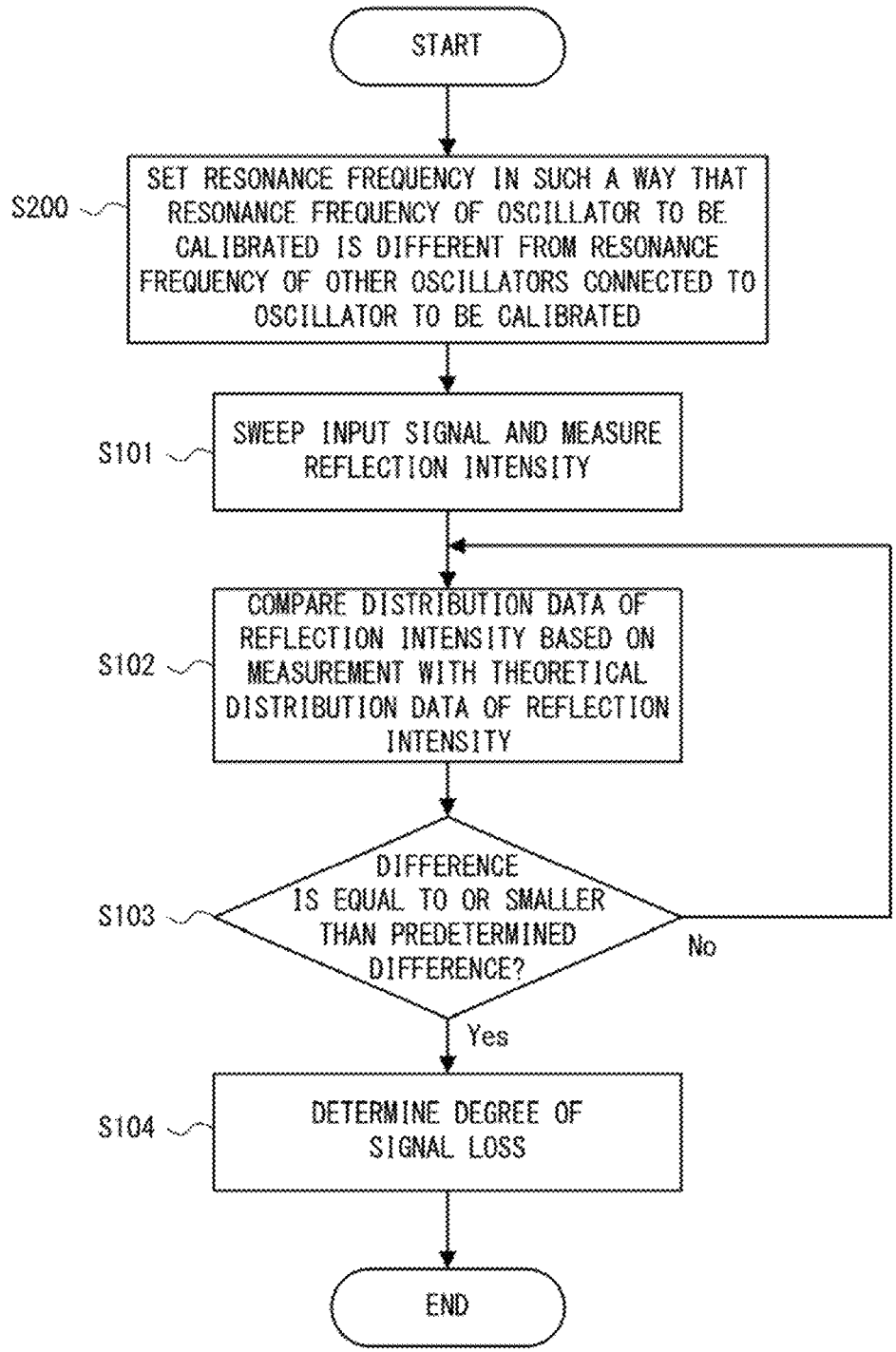
FIG. 8 is a flowchart showing one example of an operation of estimating a degree of signal loss according to a second example embodiment.

Next, a flow of the operation of estimating the degree of the signal loss according to this example embodiment will be described. FIG. 8 is a flowchart showing one example of the operation of estimating the degree of the signal loss according to the second example embodiment. The flowchart shown in FIG. 8 is different from the flowchart shown in FIG. 5 in that Step S100 is replaced with Step S200. In the following description, the point different from the flowchart shown in FIG. 5 will be described.

In Step S200, the setting controller 200 sets the resonance frequency in such a way that the resonance frequency of the oscillator 10A to be calibrated is different from the resonance frequency of the other oscillators 10B, 10C, and 10D connected to the oscillator 10A to be calibrated via the coupling circuit 30. When the resonance frequency set in the oscillator 10A to be calibrated is denoted by $f_0$, a frequency $f_1$ (where $f_1 \neq f_0$) is set as the resonance frequency of the oscillators 10B, 10C, and 10D. Note that the resonance frequencies of the oscillators 10B, 10C, and 10D may not be the same. Further, as described above, the resonance frequency of only the oscillator 10B may be set to $f_1$ and the resonance frequency of the oscillators 10C and 10D may be set to $f_0$.

Since the processes following Step S200 are the same as those shown in the flowchart in FIG. 5, the descriptions thereof will be omitted.

The second example embodiment has been described above. According to this example embodiment, it is possible to prevent the leakage of the input signal to other oscillators 10. It is therefore possible to estimate the value of the degree of the signal loss more accurately.

Note that the present disclosure is not limited to the above example embodiments and may be changed as appropriate without departing from the spirit of the present disclosure.

According to the present disclosure, it is possible to provide a calibration method, a calibration apparatus, and a program capable of estimating the degree of the signal loss of the input signal to be supplied to the oscillator.

The first and second example embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A calibration method comprising:
   outputting, from a signal generator, an input signal to be input to an oscillator to be calibrated, the oscillator comprising a resonator, wherein the resonator is a superconducting circuit that performs parametric oscillation, the input signal comprising a first AC signal and a second AC signal, wherein the first AC signal is a first microwave voltage signal and the second AC signal is a second microwave voltage signal, wherein the outputting comprises:

1) changing a power of the second AC signal, or
ii) changing a frequency of the first AC signal,
wherein the first AC signal is a probe signal for measuring the intensity of the reflection signal of the resonator and the second AC signal is a signal for exciting the resonator from a ground state to an excited state,
wherein the signal generator is coupled to the oscillator through a transmission path, and the transmission path includes a capacitor;
acquiring distribution data of an intensity of a reflection signal based on measurement of the intensity of the reflection signal from the oscillator in response to the input signal; and
estimating a degree of signal loss by comparing the distribution data acquired by the measurement with the distribution data theoretically obtained in which a value of the degree of the signal loss of the transmission path is assumed, the degree of signal loss corresponding to magnitude of power loss of the second AC signal input to the oscillator,
wherein the distribution data acquired by the measurement indicates a distribution of the intensity of the reflection signal based on the frequency of the first AC signal or based on the power of the second AC signal, and
wherein the distribution data theoretically obtained is based on an average number of photons accumulated in the resonator.

2. The calibration method according to claim 1, comprising estimating the degree of the signal loss using the distribution data when both the frequency and the power are changed.

3. The calibration method according to claim 1, wherein a range of the frequency includes a frequency that belongs to a frequency band 0.9 to 1.1 times larger than a resonance frequency of the oscillator to be calibrated.

4. The calibration method according to claim 1, wherein the oscillator to be calibrated is coupled to another oscillator via a coupling circuit, and
when the input signal is input to the oscillator to be calibrated, a resonance frequency of the other oscillator is set to a value different from that of the frequency.

5. The calibration method according to claim 4, wherein the coupling circuit couples a first set of oscillators to a second set of oscillators via a Josephson junction,
the first set of oscillators comprises the oscillator to be calibrated, and
the resonance frequency of an oscillator other than the oscillator to be calibrated among the first set of oscillators is set to a value different from that of the frequency.

6. The calibration method according to claim 5, wherein the resonance frequency of an oscillator other than the oscillator to be calibrated among the first set of oscillators and an oscillator included in the second set of oscillators is set to a value different from that of the frequency.

7. A calibration apparatus comprising:
at least one memory storing instructions; and
at least one processor configured to execute the instructions to:
cause an outputting, from a signal generator, of an input signal to be input to an oscillator to be calibrated, the oscillator comprising a resonator, wherein the resonator is a superconducting circuit that performs parametric oscillation, the input signal comprising a first AC signal and a second AC signal, wherein the first AC signal is a first microwave voltage signal and the second AC signal is a second microwave voltage signal, wherein the outputting comprises:
i) changing a power of the second AC signal, or
ii) changing a frequency of the first AC signal,
wherein the first AC signal is a probe signal for measuring the intensity of the reflection signal of the resonator and the second AC signal is a signal for exciting the resonator from a ground state to an excited state,
wherein the signal generator is coupled to the oscillator through a transmission path, and the transmission path includes a capacitor;
acquire distribution data of an intensity of a reflection signal based on measurement of the intensity of the reflection signal from the oscillator in response to the input signal; and
estimate a degree of signal loss by comparing the distribution data acquired by the measurement with the distribution data theoretically obtained in which a value of the degree of the signal loss of the transmission path is assumed, the degree of signal loss corresponding to magnitude of power loss of the second AC signal input to the oscillator,
wherein the distribution data acquired by the measurement indicates a distribution of the intensity of the reflection signal based on the frequency of the first AC signal or based on the power of the second AC signal, and
wherein the distribution data theoretically obtained is based on an average number of photons accumulated in the resonator.

8. A non-transitory computer readable medium storing a program for causing a computer to execute the following steps of:
causing an outputting, from a signal generator, of an input signal to be input to an oscillator to be calibrated, the oscillator comprising a resonator,
wherein the resonator is a superconducting circuit that performs parametric oscillation, the input signal comprising a first AC signal and a second AC signal, wherein the first AC signal is a first microwave voltage signal and the second AC signal is a second microwave voltage signal, wherein the outputting comprises:
i) changing a power of the second AC signal, or
ii) changing a frequency of the first AC signal,
wherein the first AC signal is a probe signal for measuring the intensity of the reflection signal of the resonator and the second AC signal is a signal for exciting the resonator from a ground state to an excited state,
wherein the signal generator is coupled to the oscillator through a transmission path, and the transmission path includes a capacitor;
acquiring distribution data of an intensity of a reflection signal based on measurement of the intensity of the reflection signal from the oscillator in response to the input signal; and
estimating a degree of signal loss by comparing the distribution data acquired by the measurement with the distribution data theoretically obtained in which a value of the degree of the signal loss of the transmission path is assumed, the degree of signal loss corresponding to magnitude of power loss of the second AC signal input to the oscillator,
wherein the distribution data acquired by the measurement indicates a distribution of the intensity of the reflection signal based on the frequency of the first AC signal or based on the power of the second AC signal, and wherein the distribution data theoretically obtained is based on an average number of photons accumulated in the resonator.

\* \* \* \* \*